(12) United States Patent
Diaz et al.

(10) Patent No.: US 6,440,244 B1
(45) Date of Patent: Aug. 27, 2002

(54) PROCESS OF MAKING SYNTHETIC MAGNETODIELECTRIC WITH CONTROLLED OFF-NORMAL TE AND TM RESPONSE

(76) Inventors: Rodolfo E. Diaz, 3231 E. Cottonwood La., Phoenix, AZ (US) 85004; Michael C. Miller, 3211 W. Ironwood Dr., Chandler, AZ (US) 85226; Michael M. Lo Re, 6745 N. 24th Dr., Phoenix, AZ (US) 85001; James P. K. Gilb, 908 E. Derby Dr., Tempe, AZ (US) 85284; Shahriar Alam, 1171 N. Tercera Ct., Chandler, AZ (US) 85226

( * ) Notice: Subject to any disclaimer, the term of this patent is extended or adjusted under 35 U.S.C. 154(b) by 101 days.

(21) Appl. No.: 09/611,890

(22) Filed: Jul. 7, 2000

Related U.S. Application Data

(60) Division of application No. 09/081,327, filed on May 19, 1998, now Pat. No. 6,117,517, which is a continuation-in-part of application No. 08/368,782, filed on Jan. 4, 1995, now Pat. No. 6,146,691.

(51) Int. Cl.$^7$ ............................................. B32B 31/00
(52) U.S. Cl. .......................... 156/93; 156/92; 156/148; 156/153; 156/154
(58) Field of Search ........................... 156/92, 93, 153, 156/154, 148

(56) References Cited

U.S. PATENT DOCUMENTS

| | | | |
|---|---|---|---|
| 2,605,199 A | * | 7/1952 | Hawkinson ................ 152/169 |
| 2,923,689 A | | 2/1960 | Saltzman et al. |
| 3,080,540 A | | 3/1963 | McFarland |
| 3,540,047 A | | 11/1970 | Walser et al. |
| 4,538,151 A | | 8/1985 | Hatakeyama et al. |
| 4,731,286 A | | 3/1988 | Yamashita et al. |
| 5,081,455 A | | 1/1992 | Inui et al. |
| 5,384,185 A | * | 1/1995 | Bovenschen et al. ....... 428/116 |
| 5,385,623 A | | 1/1995 | Diaz |
| 5,498,644 A | | 3/1996 | Reo |
| 5,549,771 A | * | 8/1996 | Brooker ...................... 156/153 |
| 6,051,089 A | * | 4/2000 | Palmer et al. ........... 156/303.1 |
| 6,289,958 B1 | * | 9/2001 | Dheur et al. ............. 152/152.1 |

OTHER PUBLICATIONS

*The Study of a Ferrofluid Exhibiting Both Brownian and Neel Relaxation*, P.C. Fannin and S.W. Charles, 1989 IOP Publishing Ltd., pp. 187–191.

Artificial Dielectric Properties of Microscopic Metallized Filaments in Composites, W. Stockton, J. Lodge, F.Rachford, M. Orman, F. Falco, and P. Schoen, Journal of Applied Physics 70 (9), Nov. 1, 1991, pp. 4679–4986.

Interaction of Metallized Tubules with Electromagnetic Radiation, F. Behroozi, M. Orman, R. Reese, W. Stockton, J, Calvert, F. Rachford, and P. Schoen, Journal of Applied Physics, 68 (7), Oct. 1, 1990, pp. 3688–3693.

*Electrodynamics of Continuous Media*, L.D. Landau and E.M. Lifshitz, Pergamon Press, Oxford, 1984, pp. 205–206.

* cited by examiner

*Primary Examiner*—Jeff H. Aftergut
(74) *Attorney, Agent, or Firm*—Bruce B. Brunda; Stetina Brunda Garred & Brucker

(57) ABSTRACT

A synthetic magnetodielectric composite material for absorbing electromagnetic radiation has a sheet of fabric having first and second surfaces. The fabric is formed of an insulating material. Magnetically permeable thread is disposed within the fabric. The magnetically permeable thread comprises a material having a permeability substantially greater than the permeability of free space. The fabric is impregnated with resin. The magnetically permeable thread is configured to provide predetermined permittivity and permeability within a selected frequency range, so as to provide desired absorption/transmission of electromagnetic radiation.

44 Claims, 6 Drawing Sheets

PROCESS OF MAKING SYNTHETIC MAGNETODIELECTRIC WITH CONTROLLED OFF-NORMAL TE AND TM RESPONSE

RELATED APPLICATIONS

This patent application is a division of Ser. No. 09/081327 filed May 19, 1998 now U.S. Pat. No. 6,117,517 which is a continuation-in-part of patent application of U.S. patent application Ser. No. 08/368,782, filed Jan. 4, 1995, now U.S. Pat. No. 6,146,691 and entitled HIGH PERFORMANCE MATCHED ABSORBER USING MAGNETODIELECTRICS.

FIELD OF THE INVENTION

The present invention relates generally to electromagnetic radiation absorbent materials and relates more particularly to an improved composite electromagnetic radiation absorbent/transmissive material having controlled off-normal TE and TM response.

BACKGROUND OF THE INVENTION

Electromagnetic radiation absorbing materials are used in a variety of applications. They are commonly used in Electromagnetic Compatibility/Electromagnetic Interference (EMC/EMI) test cells to eliminate reflection and interference during testing. Electromagnetic radiation absorbers are also used in electromagnetic anechoic chambers for testing high frequency radar, in antennas and in Low Observable (LO) structures. The increase in consumer electronics that broadcast, such as cellular telephones and portable computers, have created a new need: the suppression of stray electromagnetic signals in airplanes and near airports to prevent interference with airport radar, communications and automated landing systems. Intelligent Vehicle Highway Systems (IHVS) may also require the suppression of stray electromagnetic signals to prevent multi-path and other types of interference.

Previously, electromagnetic absorbers used only either the electric or the magnetic properties of a material to attenuate the electromagnetic fields. Electric absorption is normally achieved by introducing lossy material, often carbon, to a low dielectric constant material. Examples of this approach include carbon loaded foam and carbon loaded honeycomb. An alternate method is to use specific patterns of the lossy material to achieve a Debye relaxation of the dielectric constant. See U.S. patent application Ser. No. 07/890,757 entitled METHOD FOR MAKING A MATERIAL WITH ARTIFICIAL DIELECTRIC CONSTANT, now U.S. Pat. No. 5,385,623, the disclosure of which is incorporated by reference. The relaxation of the dielectric constant produces a loss in the material that can be accurately controlled in both magnitude and frequency.

Magnetic loss is generally achieved by using a material that exhibits a natural magnetic loss mechanism. Ferrites are a class of material that exhibit this type of loss and are often used in absorbing materials. However, in the frequency range where the ferrite's loss is useful, the real part of their relative permittivity and real part of their relative permeability are very different from each other. The result is that the material's impedance is not close to the impedance of free space and a significant part of the incident energy reflects off the surface. Only when the interference between the surface reflection and reflection from the surface underneath the ferrite cancel each other does the material exhibit its full loss. Therefore, absorbers which use ferrites are only effective over a very limited band of frequencies.

The performance of electromagnetic absorbing materials can be improved through grading the electric and magnetic properties within the material and/or by shaping the material. However, even with these techniques, the current state of the art of electromagnetic absorbers results in materials that are either very thick, or work only over a narrow band of frequencies. For example, carbon-loaded, foam pyramids used in EMC/EMI test cells are approximately 10 feet long and require ferrite tiles on their base to achieve 10 dB of absorption from 10 MHz to 1 GHz. The size and weight of the pyramids places special requirements on room size and the load bearing capacity of the walls and ceiling.

Moreover, absorbing an electromagnetic wave incident from free space onto the material involves two important steps:

1. Getting the majority of the power of wave to enter the material; and
2. Dissipating the power of the wave as heat using the loss mechanisms in the material.

The first condition is controlled by the thickness of the material, the frequency of the incident wave and the intrinsic impedance of the material. The intrinsic impedance of the material is given by:

$$Z_m = \sqrt{\frac{\mu}{\epsilon}} = \sqrt{\frac{\mu_0}{\epsilon_0}}\sqrt{\frac{\mu_r}{\epsilon_r}} = \eta\sqrt{\frac{\mu_r}{\epsilon_r}} \quad (1)$$

where $\mu$ is the permeability of the material, $\mu_0$ is the permeability of free space, $\mu_r=\mu/\mu_0$ is the relative permeability, $\in$ is the permittivity of the material, $\in_0$ is the permittivity of free space, $\in_r=\in/\in_0$ is the relative permittivity of the material and $\eta= (\mu_0/\in_0)^{1/2}=377\Omega$ is the impedance of free space. Note that the permittivity and permeability of materials are generally complex and frequency dependent, i.e.:

$$\mu=\mu'(f)-j\mu''(f) \quad (2)$$

$$\in=\in'(f)-j\in''(f) \quad (3)$$

where $j=(-1)^{1/2}$ is the imaginary unit. When the impedance of the material is the same as free space, all of the power in the incident wave enters the material regardless of the thickness or operating frequency. Clearly, the impedance of the material will be equal to free space when $\mu_r=\in_r$.

The second condition is controlled by the loss that the electromagnetic wave experiences once it has entered the material. The power dissipated, $P_L$, is roughly proportional to an exponential function:

$$P_L e^{-2\gamma 1} \quad (4)$$

where 1 is the thickness of the material and $\gamma$ is the complex propagation constant given by:

$$\gamma=j2\pi f\sqrt{\mu\in} \quad (5)$$

and f is the operating frequency of the wave. The loss, which is the real part of $\gamma$, comes from the imaginary parts of the permittivity and/or permeability, $\mu''$ and $\in''$. So, to attenuate the wave, the material should have large imaginary parts of the permittivity and/or permeability.

Thus the ideal absorbing material is one which has an impedance equal to free space and is as lossy as possible. This give the conditions:

$$\mu_r(f) = \epsilon_r(f) \quad (6)$$

and $$\mu_r(f) \epsilon_r(f) \to \infty \quad (7)$$

For this ideal material, increasing the imaginary parts of the permittivity and permeability decreases the thickness of the absorbing material required to achieve a desired level of performance. For practical absorber design, the above criteria are required over a broad but finite band of frequencies.

Hexcel has produced materials with controlled, frequency dependent anisotropic dielectric properties using Debye relaxations (U.S. patent application Ser. No. 07/890,757). Magnetic loss which exhibits Debye-like behavior can be obtained in one of two ways: (1) using natural, lossy magnetic materials, such as ferrites; or (2) using the skin-effect of permeable, conducting materials (L. D. Landau and E. M. Lifshitz, *Electrodynamics of Continuous Media*, Pergamon Press, Oxford, 1984) as in a laminated magnetic transformer core. The Debye relaxation of the real part of either the permittivity or permeability produces an imaginary part that contributes to power dissipation in the material.

Since both electric and magnetic materials can exhibit controlled anisotropic Debye-like behavior, it is possible to design a material that has an impedance that is anisotropic and essentially matched to free space over the desired band of frequency, and has both magnetic and electric loss mechanisms. It would be desirable to provide a composite material that combines synthetic dielectric materials with a lossy magnetic material (either natural or skin-effect) to reduce the scattering from composite structures. The amount of materials, shaping and material properties are selected by the designer so that the relative permittivity and permeability are substantially the same so that the impedance at the given angle matches that of free space at that angle over the frequency range of interest, with the composite material exhibiting both electric and magnetic loss mechanisms. The performance of the composite material can be enhanced by grading the properties of the material and/or shaping the material, just as with prior art materials.

The particular structure scattering problem addressed by this invention is the scattering of electromagnetic waves at shallow angles from dielectric surfaces.

The shallow angle problem arises, for instance, in the design of missile radomes for gimballed antennas. Because of stringent aerodynamic requirements, these radomes must have very high aspect ratios. Therefore, when the radar is looking forward, its signal traverses the radome wall at a very shallow angle. The TM component of the wave (electric field is parallel to the plane of incidence) transmits readily through the dielectric, owing to the onset of the Brewster angle phenomenon, while the TE component (electric field perpendicular to the plane of incidence) reflects very strongly off the dielectric interface. The net result is that the radar signal suffers severe depolarization and a significant internal echo in the TE polarization, leading to the so called "flashlobes".

A similar problem arises in the construction of composite panel absorbers for low observable applications. Such panels always contain an outer dielectric skin of finite thickness dictated by mechanical and environmental requirements. At low frequencies, the skin is electrically thin and has little effect on the design. However, at high frequencies, as the skin thickness approaches the quarter wave anti-resonance, the skin becomes a strong scatterer and in fact becomes the limiting parameter in the design. Just as in the case of the radome, this problem gets exacerbated when the angle of incidence moves off the normal. An absorber panel with good performance at normal incidence remains very good for the TM polarization as the angle of incidence moves off the normal (due to the Brewster angle) but it degrades very rapidly for the TE polarization (since then less and less energy penetrates the skin to get absorbed in the panel).

Finally, the same problem arises in the area of automotive radar. Multi-path scattering off the road at shallow angles, which causes undesirable and dangerous interference, is always worse for the TE polarization.

These applications highlight the need for a material whose polarization response at shallow angles can be tailored to the particular need. To do this requires synthetic magnetodielectrics.

The Brewster angle phenomenon for TM waves arises from an impedance matching effect at the air-dielectric interface as the angle of incidence moves away from the normal. An identical phenomenon would occur for the TE polarization if instead of an air-dielectric interface there was an air-magnetic interface. It can be readily calculated that near 45° incidence, a material with a permeability twice as high as its permittivity can become perfectly transparent. In fact, any amount of magnetic permeability added to a dielectric would be an improvement and serve to reduce the TE reflection coefficient. Of course, any action taken to improve the TE polarization will tend to worsen the TM response. However, since the TM polarization is so good to begin with, there is ample room to effect this trade-off.

In view of the foregoing, it is desirable to provide a method for forming composite electromagnetic absorbers that provide increased electromagnetic radiation absorption and which are thinner and/or lighter than those of the prior art. More particularly, it is desirable to provide synthetic dielectric materials which are combined with either synthetic magnetic materials or magnetically lossy materials in such a way that the impedance of the composite material is substantially matched over the desired range of angles and frequency. The match in impedance allows the majority of the electromagnetic fields to enter the material so that the electric and magnetic loss components are able to absorb the electromagnetic energy.

SUMMARY OF THE INVENTION

The present invention specifically addresses and alleviates the above-mentioned deficiencies associated with the prior art. More particularly, the present invention comprises a synthetic magnetodielectric composite material having controlled off-normal TE and TM responses for absorbing/transmitting electromagnetic radiation.

The synthetic magnetodielectric composite material comprises a sheet of fabric having first and second surfaces. The fabric is preferably formed of an insulating material.

Magnetically permeable thread is disposed within the fabric. The magnetically permeable thread comprises a material having a permeability substantially greater than the permeability of free space. The fabric is impregnated with resin.

The magnetically permeable thread is configured to provide predetermined permittivity and permeability within a selected frequency range, so as to provide desired absorption/transmission of electromagnetic radiation within that frequency range.

According to the preferred embodiment of the present invention, the magnetically permeable thread is configured so as to provide approximately equal off-normal TE and TM response within the selected frequency range. The magnetically permeable thread preferably comprises material having a permeability substantially greater than the permeability of free space. The magnetically permeable thread preferably comprises material having a relative permeability greater than approximately 30 in the frequency range of approximately 2 GHz to approximately 18 GHz.

According to a preferred embodiment of the present invention the synthetic magnetodielectric composite material further comprises a material having a permittivity naturally greater than the permittivity of free space. The fabric preferably comprises an insulating material. The sheet of fabric naturally comprises material having a permittivity greater than the permittivity of free space. The resin also comprises a material having a permittivity greater than the permittivity of free space.

The magnetically permeable thread preferably defines a plurality of generally rod-like magnetically permeable elements which extend generally from the first surface of the fabric to the second surface of the fabric. Each magnetically permeable element generally comprises a first end proximate the first surface of the fabric and a second end proximate the second surface of the fabric.

Thus, the magnetically permeable thread generally defines a plurality of generally rod-like magnetically permeable elements, each magnetically permeable element being oriented generally normal to the first and second surfaces of the fabric.

The generally rod-like magnetically permeable elements are formed by removing those portions of the magnetically permeable thread which are disposed proximate the first and second surfaces of the fabric.

According to one configuration of the present invention the magnetically permeable thread preferably comprises an insulating material having magnetically permeable coating formed thereon. The magnetically permeable thread preferably comprises an insulating material having a metal coating, preferably nickel, formed thereon. The magnetically permeable thread preferably comprises an insulating material having a coating of surface-oxidized, substantially pure nickel formed thereon.

The impedance of the synthetic magnetodielectric composite material of the present invention is preferably approximately equal to that of free space at the design angle of incidence. The imaginary parts of the permittivity and permeability are sufficiently large so as to provide the desired electromagnetic radiation absorption/transmission trade-off.

Further, according to the preferred embodiment of the present invention, the magnetically permeable thread comprises microfibers, preferably plastic microfibers. The magnetically permeable thread preferably comprises dielectric fibers having magnetically permeable coating formed thereon. The diameter of the fibers is preferably less than 2½ times the thickness of the magnetically permeable coating.

According to an alternative configuration of the present invention, the magnetically permeable thread alternatively comprises substantially solid metal fibers, preferably surface oxidized, substantially pure nickel microfibers.

According to an alternative configuration of the present invention, the fabric is pre-impregnated with resin. Alternatively, the resin impregnated fabric comprises fabric to which the resin is applied immediately prior to curing, i.e., the fabric is not pre-impregnated with resin.

According to the preferred embodiment of the present invention, the magnetically permeable thread is comprised of a plurality of magnetically permeable fibers separated from one another by dielectric material. The magnetically permeable thread preferably comprises at least one thousand magnetically permeable fibers separated from one another by dielectric material.

According to the methodology of the present invention, a synthetic magnetodielectric composite material for absorbing/transmitting electromagnetic radiation is formed by providing a sheet of fabric formed of an insulating material, the sheet having first and second surfaces. Magnetically permeable thread is placed into the fabric. The magnetically permeable thread comprises a material having a permeability greater than the permeability of free space. The fabric is impregnated with resin and the resin impregnated fabric is then cured.

The magnetically permeable thread is configured to provide predetermined off-normal TE and TM response within a selected frequency range, so as to provide desired absorption of electromagnetic radiation.

The magnetically permeable thread is preferably configured so as to provide approximately equal off-normal TE and TM response within the selected frequency range. The step of placing magnetically permeable thread into the fabric preferably comprises placing a thread having a permeability substantially greater than the permeability of free space into the fabric. The step of placing magnetically permeable thread into the fabric preferably comprises placing thread having a permeability substantially greater than the permeability of free space into the fabric. The step of placing magnetically permeable thread into the fabric preferably comprises placing thread having a relative permeability greater than 30 in the frequency range of 2 GHz to 18 GHz into the fabric.

The step of providing a fabric preferably comprises providing a fabric comprising a material having a permittivity naturally greater than the permittivity of free space. The step of providing a fabric preferably comprises providing a fabric comprising a material having a relative permittivity no greater than approximately 10 in the frequency range of approximately 2 GHz to approximately 18 GHz. The step of providing a sheet of fabric preferably comprises providing a sheet of fabric having a permittivity greater than the permittivity of free space. The step of impregnating the fabric with resin preferably comprises impregnating the fabric with resin having a permittivity greater than the permittivity of free space. The permeability and the permittivity of the synthetic magnetodielectric composite material are such that the impedance is matched to free space and the imaginary parts of the permeability and the permittivity are preferably sufficiently large so to provide the desired electromagnetic radiation absorption/transmission therewith.

The step of placing magnetically permeable thread into the fabric preferably comprises placing the magnetically permeable thread into the fabric so as to define a plurality of magnetically permeable elements which extend generally from the first surface of the fabric to the second surface of the fabric, each magnetically permeable element generally comprising a first end proximate the first surface and a second end proximate the second surface of the fabric. The step of placing magnetically permeable thread into the fabric preferably comprises placing the magnetically permeable thread into the fabric and removing those portions of the magnetically permeable thread which are disposed externally proximate the first and second surfaces of the fabric, so as to define a plurality of magnetically permeable elements. The step of providing a sheet of fabric preferably comprises providing an insulating material.

The step of placing magnetically permeable thread into the fabric preferably comprises placing thread comprising an insulating material having a magnetically permeable coating formed thereon into the fabric.

The step of placing magnetically permeable thread into the fabric preferably comprises placing thread comprising metal, preferably nickel, into the fabric.

The step of placing magnetically permeable thread into the fabric preferably comprises placing thread comprising an insulating material having a coating of surface-oxidize, substantially pure nickel formed thereon into the fabric.

The step of placing magnetically permeable thread into the fabric preferably comprises placing thread comprising microfibers into the fabric.

The step of placing magnetically permeable thread into the fabric preferably comprises placing thread comprising plastic microfibers into the fabric.

The step of placing magnetically permeable thread into the fabric preferably comprises placing thread comprised of dielectric fibers having a magnetically permeable coating formed thereon into the fabric. The diameter of the fibers is preferably less than 2½ times the thickness of the magnetically permeable coating.

The step of placing magnetically permeable thread into the fabric preferably comprises placing thread comprised of substantially solid metal microfibers into the fabric.

The step of placing magnetically permeable thread into the fabric preferably comprises placing thread comprised of surface oxidize, substantially pure nickel fibers into the fabric.

The step of impregnating the fabric with resin preferably comprises pre-impregnating the fabric with resin.

The step of impregnating the fabric with resin alternatively preferably comprises applying the resin to the fabric immediately prior to curing, i.e., not pre-impregnating the fabric with resin.

The step of placing magnetically permeable thread into the fabric preferably comprises placing a plurality of magnetically permeable fibers into the fabric.

The step of placing the magnetically permeable thread into the fabric preferably comprises placing the magnetically permeable thread into the fabric such that it extends repeatedly from proximate the first surface to proximate the second surface thereof. The first and second a surfaces of the fabric are preferably abraded after curing, so as to remove the thread proximate the first and second surfaces of the fabric, so as to form a plurality of permeable elements within the fabric. Those skilled in the art will appreciate that various other methods may be utilized to remove portions of the thread proximate the first and second surfaces of the fabric. For example, mechanical cutting, laser cutting, chemical etching, etc. may alternatively be utilized.

The step of placing magnetically permeable thread into the fabric preferably comprises sewing the thread into the fabric. Alternatively, the step of placing magnetically permeable thread into the fabric comprises weaving the thread into the fabric. Those skilled in the art will appreciate that various other techniques may be utilized to place the thread in the fabric.

An electromagnetic radiation absorbing/transmitting composite structure is formed by providing a sheet of fabric having first and second surfaces, the fabric being formed of an insulating material, placing magnetically permeable thread into the fabric, the magnetically permeable thread having a permeability greater than the permeability of free space, and removing portions of the thread proximate the first surface of the fabric. The fabric is then impregnated with resin and the resin impregnated fabric added to a pre-existing composite structure (such as an aircraft wing, a building wall, or an electronic equipment enclosure) with the first surface of the resin impregnated fabric contacting the pre-existing composite structure. The resin impregnated fabric is then cured and portions of the thread proximate the second surface of the fabric are removed.

Removing portions of the thread proximate the first and second surfaces of the fabric defines magnetically permeable elements disposed generally normal to the first and second surfaces of the fabric.

A method for forming an electromagnetic radiation absorbing/transmitting composite material suitable for application to a composite structure alternatively comprises the steps of providing a sheet of fabric having first and second surfaces, the fabric being formed of an insulating material. Magnetically permeable thread is pre-impregnated with resin. The magnetically permeable thread has a permeability greater than the permeability of free space. The resin impregnated magnetically permeable thread is placed into the fabric. The resin pre-impregnated magnetically permeable thread is cured so as to cause the magnetically permeable thread to substantially affix to the fabric. Portions of the magnetically permeable thread proximate the first and second surfaces of the fabric are removed so as to define magnetically permeable elements disposed generally normal to the first and second surfaces of the fabric.

According to this alternative method for forming an electromagnetic radiation absorbing/transmitting composite material, a sheet of substantially flexible composite material is provided which may be fitted or conformed to the shape of a preexisting composite structure so as to facilitate application thereto. Thus, curing of the pre-impregnated magnetically permeable thread affixes the threads to the fabric without undesireably making the fabric too rigid to conform to a desired structural shape or configuration. After the electromagnetic radiation absorbent composite material so formed has been applied to a preexisting structural surface, it may be impregnated with resin and cured so as to form a portion of the preexisting structure. These, as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 3b is an enlarged end view of a single microfiber of FIG. 3a;

DETAILED DESCRIPTION OF THE INVENTION

The detailed description set forth below in connection with the appended drawings is intended as a description of the presently preferred embodiments of the invention, and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

One object of the present invention is to increase the effective permeability of the material without significantly increasing the effective permittivity for waves incident at shallow angles as discussed below.

Figure 1:
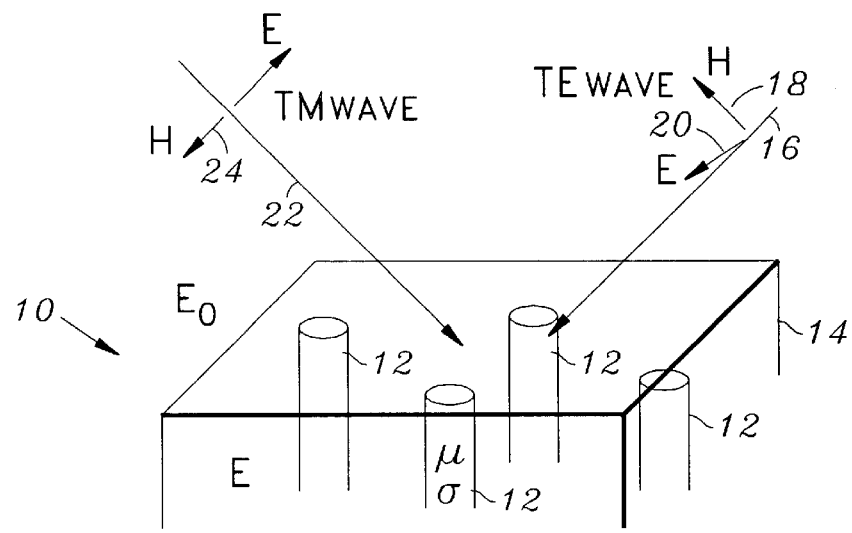
FIG. 1 is a perspective drawing showing the orthogonal electric (E) and magnetic (H) fields for both the transverse magnetic (TM) and the transverse electric (TE) cases wherein such electromagnetic radiation is incident at an off-normal angle upon an synthetic magnetodielectric composite material according to the present invention.

Referring now to FIG. 1, first consider a material 10, wherein an array of magnetically permeable rods 12 are embedded in the dielectric 14. The wave 16 of the TE magnetic field 18 has a component along the axes of the rods 12 and so, to the TE wave 16, the material appears to have a high effective permeability. To first order this permeability is proportional to the area fraction of the periodic unit cell that is covered by the metal in cross section. At the same time, since the electric field 20 of the TE wave 16 is perpendicular to the rods 12, the effective permittivity for the TE wave 16 is slightly enhanced by the transverse dipole moment induced on the rods 12. If the increase in permeability contributed by the rods 12 is sufficiently greater than the increase in permittivity contributed thereby, then the material 10 will have a lower TE reflection coefficient than the original pure dielectric.

For the TM wave 22, the material 10 looks entirely different. Now there are metal rods 12 aligned with the electric field. If these rods 12 are spaced very close to each other as compared to the wavelength, the material 10 looks like a surface wave structure (such as a corrugated ground plane or a Yagi antenna array.) So, to first order, the rods 12 add to the dielectric an extra artificial permittivity, which worsens slightly the TM echo. However, the TM 24 field of the TM wave 22 also induces a slight dipole moment on the rods 12, creating an additional permeability component that helps offset this echo. The degree to which the rods 12 perturb the incident TM wave 22 is controlled by the distribution of the rods 12; that is, the ratio of the periodic cell size to the length of the rods 12.

Figure 2A:
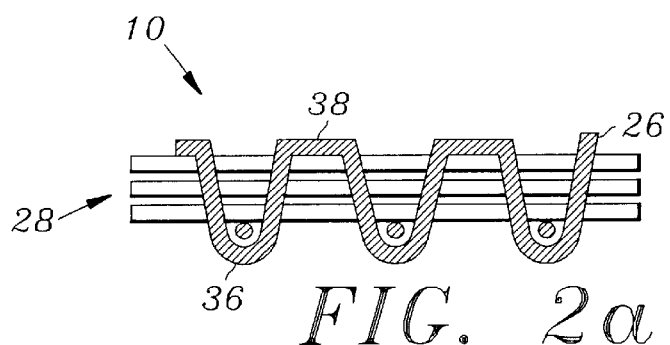
FIG. 2a is a cross sectional side view showing a sheet of fabric having magnetically permeable thread sewn thereinto.
Figure 2B:
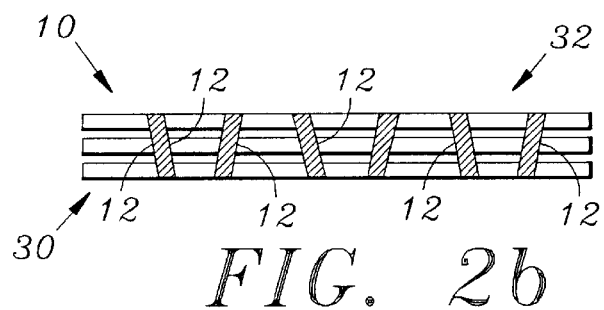
FIG. 2b is the sheet of fabric of FIG. 2a wherein the magnetically permeable thread disposed proximate the first and second surfaces of the fabric has been removed so as to define a plurality of electromagnetic elements.
Figure 2C:
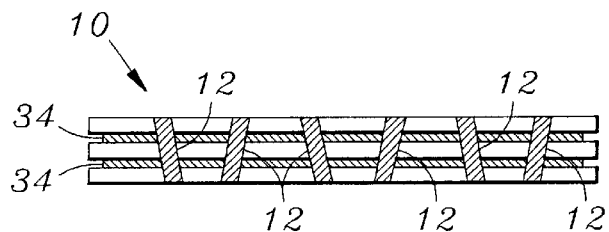
FIG. 2c shows the fabric and magnetically permeable elements of FIG. 2b, wherein resin has been applied and cured so as to define a composite structure.

Referring now to FIGS. 2a–2c, according to the present invention, the rods 12 are preferably individual threads 26 of nickel-coated filaments or the like. These threads 26 are stitched into the web or fabric 28 that is to become the composite skin using standard sewing technology or existing three-dimensional stitching/weaving technology.

As shown in FIG. 2b, inner or first surface 30 of the fabric 28 is abraded or otherwise removed to remove the first surface interconnecting lengths of thread 36. Then, as shown in FIG. 2c, the fabric 28 is impregnated with the desired resin 34 and introduced into a pre-existing composite structure. After curing, the outer or second surface 32 is abraded to remove the second surface interconnecting pieces 36 of thread.

An alternative method is to pre-impregnate the thread 26 itself before the sewing operation. After all the thread 26 is sewn into fabric 28, the fabric 28 undergoes a "pre-cure" cycle which causes the loading thread's 26 resin to flow and cure, thus affixing the fibers internally to the fabric 28. Thus, both sides 30, 32 of the fabric 28 can be abraded to remove the interconnecting lengths 36, 38 of thread 26 and a flexible mostly un-impregnated fabric 28 is provided which can be incorporated into any composite manufacturing process, including radar transparent material such as that utilized in the construction of radomes.

The critical parameters for the performance of the composite material of the present invention are those that control the ratio of the increase in permeability to the increase in permittivity at the desired angle. The effect of those parameters at normal incidence are then used in a trade-off exercise to balance out the performance of the overall structure.

The relative weighing of the trade-off alternatives depends on the application. For the radome application, good performance is required at all angles. For the low observable skin, the off-normal performance may be as important as the normal performance or it may be critical only at certain frequencies. For the automotive radar pavement, since no transmission is expected to be sent perpendicularly towards the surface, the trade-off is heavily weighted towards the shallow angles.

The application also determines the design of the synthetic magnetodielectric. For the radome, maximum transmission is desirable. Therefore, magnetic rods which contribute a purely real permeability are required. For low observable panel skin, a lossy medium is provided underneath the skin, so it may or may not be necessary to have loss in the skin itself. For the absorbing pavement maximum loss is desired. The degree of loss in the material's effective permeability is directly controlled by the thickness of the nickel laminate relative to the skin depth at the frequency of concern.

Thus, the synthetic magnetodielectric of the present invention may be configured so as to either substantially absorb or substantially transmit electromagnetic radiation incident thereupon, as desired. Clearly, the desired approach, i.e., substantially absorbent and/or substantially transmissive, is application dependent.

The sewing method described above is applicable to both the radome and the low observable skin fabrication. With low cost fabrics it may also be applicable to a composite pavement overcoat. For low frequencies, requiring longer elements, other methods of imbedding the magnetic metal rods into the dielectric surface can be devised by the practitioner.

Although a specific example of the use of the synthetic magnetodielectric material of the present invention is provided herein as a composite skin or surface, those skilled in the art will appreciate that the present invention is suitable for use in a variety of different applications. Thus, discussion of the present invention as a composite skin is by way of example only and not by way of limitation.

Obtaining multi-layer magnetic laminate behavior in a thread requires the thread to be made of a large number of mutually insulated magnetic metal filaments. A thread comprised of surface-oxidized pure nickel microfibers is preferred. Methodology for forming nickel microfibers is provided in *Artificial Dielectric Properties of Microscopic Metallized Filaments in Composites*, W., J. Lodge, F. Rachford, M. Orman, F. Falco, and P. Schoen, Journal of Applied Physics 70 (9), Nov. 1, 1991; and *Interaction of Metallized Tubules with Electromagnetic Radiation*, by F. Behroozi, M. Orman, R. Reese, W. Stockton, J. Calvert, F. Rachford, and P. Schoen, Journal of Applied Physics, 68 (7), Oct. 1, 1990, both of which are hereby incorporated by reference.

Alternatively, thread comprised of plastic microfibers, each of which is individually coated with the desired thickness of the magnetic metal may be utilized. The preferred diameter of the microfibers is approximately less than two and a half times the required thickness of the nickel coating. Otherwise, too much dead or non-magnetic space is taken up by the plastic.

An economical way of accomplishing the construction of this magnetic thread is to use DuPont's MICROMATTIQUE 199(135)-200-69IT microfiber having a diameter of 5880 Å, spun into the desired thickness of the thread. The spool of thread is then immersed in an electroless nickel deposition bath. When the time and temperature controls of the deposition process yield the desired thickness of coating, the spool is withdrawn from the bath and worked in an ambient air atmosphere. The exposure to the air environment coats all the nickel surfaces with a thin insulating layer of nickel oxide, and the thread is ready for use.

The laminate thickness for diamagnetic relaxation of a magnetic metal layer is given approximately by the equation:

$$t = 2\sqrt{\frac{2\rho}{\omega\mu_0\mu_i}} \quad (8)$$

The resistivity, $\rho$, of nickel is of the order of $6.8\times10^{-8}$ Ohm-m, and its intrinsic permeability in the 2 GHz to 18 GHz frequency range is of the order of 30.0. Therefore, in order to make the laminate have a mostly real permeability over this frequency band, the relaxation should be placed out towards 40 GHz, giving the thickness t=2250 Å. The selected microfibers then are just a little more than two and a half times the required nickel thickness and are acceptable for this application. If a lossy material in this frequency range is desired, then the relaxation frequency would be somewhere inside the 2 GHz to 18 GHz band and the nickel thickness would have been greater. In this case, the ratio of metal to plastic gets better and so the selected DuPont MICROMATTIQUE fibers are useful for a wide range of applications.

Figure 3B:
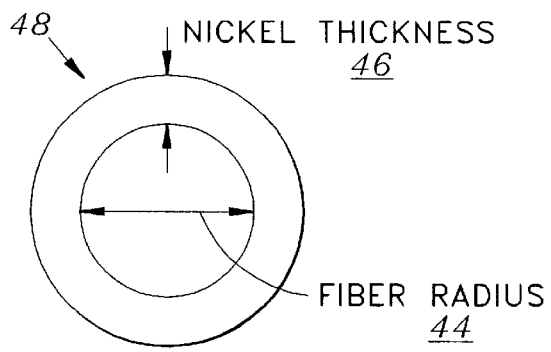
Figure 3A:
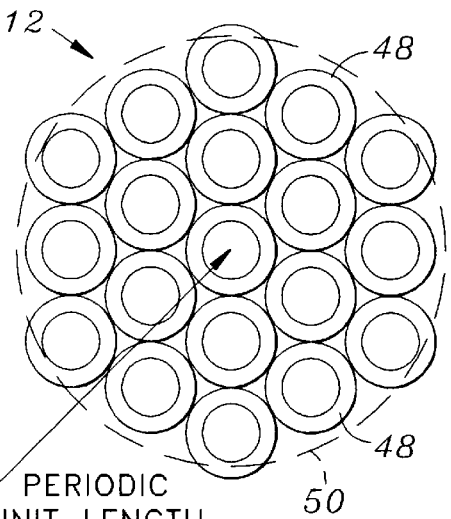
FIG. 3a illustrates the geometry associated with adjacent magnetically permeable threads, each of which are comprised of a plurality of microfibers, each microfiber being coated with a magnetically permeable material.
Figure 3A:
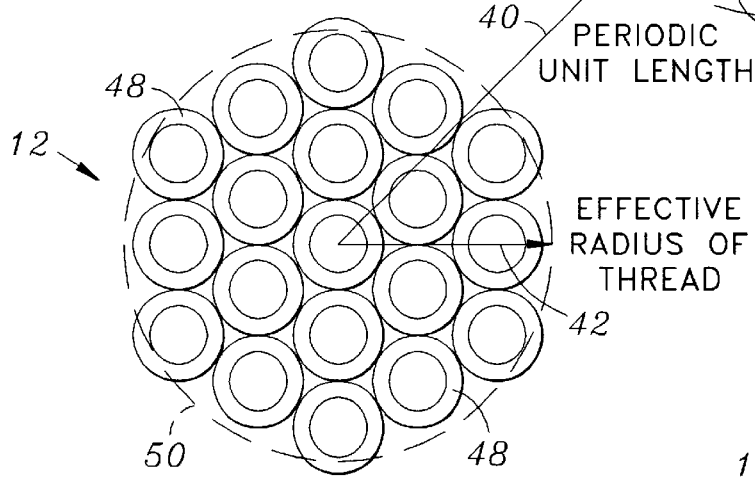

Referring now to FIGS. 3a and 3b, thread made from such fibers preferably contains thousands of individual filaments or microfibers 48. For the purpose of estimating the electromagnetic properties of the synthetic magnetodielectric, we consider the idealized geometry of FIGS. 3a and 3b, wherein the periodic unit length 40 and the effective radius of the thread 42 are shown in FIG. 3a and wherein the fiber radius 44 and the nickel thickness 46 are shown in FIG. 3b.

Figure 4:
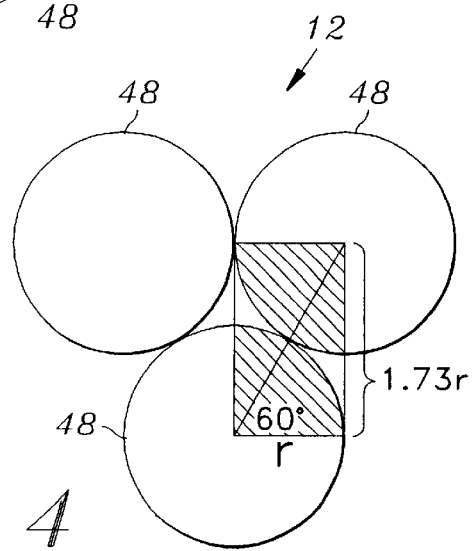
FIG. 4 is a schematic representation of three microfibers showing the hexagonal packing density thereof.

Referring now to FIG. 4, hexagonal packing of the thread's 12 microfibers 48 is shown. In an area 1.73r by r there is half of one microfiber 48 so that the filling fraction of the microfibers 48 is:

$$\frac{1/2\pi r^2}{1.73r^2} = 0.907. \quad (9)$$

of each microfiber 48, only:

$$\frac{\pi(5880+2250)^2 - \pi(5880)^2}{\pi(5880+2250)^2} = 0.477 \text{ is metal.} \quad (10)$$

Therefore the total area occupied by the thread 12, 43% is magnetic metal (0.477×0.907). If an area density of metal of 13% of the unit cell is desired, the threads 12 will consume 30% (0.13/0.43) of the unit cell's area. In a Cartesian Grid this means that the center to center distance between the threads is approximately 1.62 diameters. In a Hexagonal close packed arrangement the distance is approximately 2.15 diameters. These calculations hold whether each "thread" is one thread or a bundle of threads. The driving factor is the ratio of microfiber 48 diameter to metal coating thickness 46.

The choice of how many microfibers 48 to combine in a thread 12 is strictly determined by the desired dimensions of the periodic unit cell. One extreme is to require the unit cell's dimensions to be of the order of the skin thickness. Another extreme is to require only one thread 12 per unit cell. The first extreme makes the metal unit element as "spherical" as possible, the second makes it as elongated as possible. The difference between the polarizabilities of these two extremes allows us to choose the proper dimensions depending on the desired properties of the material.

Figure 5:
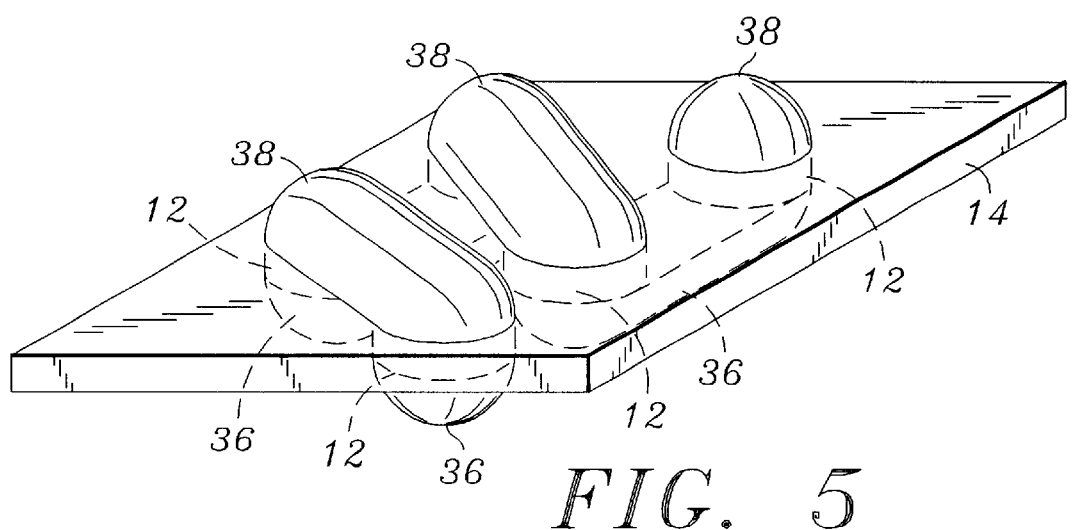
FIG. 5 is a perspective view of a thread sewn through a fabric, showing the limitation in packing density due to the physical presence of adjacent portions of the sewn thread and the need to have some of the fiber disposed intermediate such portions.

Referring now to FIG. 5, the geometric calculations above show why the microfiber 48 diameter has a maximum limit. Since the desired permeability dictates the amount of magnetic metal required, and since the ratio of fiber 48 diameter to coating thickness determines the total thread 12 cross section, a limit can be reached where the thread cannot be physically sewn into the fabric. This limit is rapidly approached when the required thread diameter is a substantial fraction (>0.7) of the unit cell dimension.

A quasi-static approach should yield a good enough estimate of the properties to initiate the design process. Empirical data from manufacturing attempts can then be used to fine tune the final design.

The effective permeability of the skin for a magnetic field normal to the skin and parallel to the fibers will be approximately given by:

$$\mu_z^{eff}=(\mu_i-1)*f_a^{\mu_i}+1.0 \quad (11)$$

Here $f_a^{\mu_i}$ is the fraction of the area of the periodic unit cell occupied by the magnetic metal. This expression, which is valid for a medium that is infinite in extent in the z-direction, will be valid for the skin of finite thickness as long as the magnetic field is mostly contained inside the permeable filaments 48. The parameter that most strongly controls this is the aspect ratio of the thread 12 relative to the dimensions of the period unit cell 50.

For an electric field aligned with the fibers 48, the increase in permittivity arises from the induced dipole moments on the metal rods. This dipole moment is also controlled by the aspect ratio of the thread 12 relative to the periodic unit cell 50. And so, $\in_z^{eff}$ has a functional form very similar to $\mu_z^{eff}$. In fact, if the permeability of the threads 12 were infinite, the increase in permeability for a z-directed H-field would equal the increase in permittivity for a z-directed E-field. To the degree that $\mu_i$ is not infinite, to that degree the permeability increase is degraded.

For nickel in the Gigahertz range, the intrinsic permeability is of the order of 30. This is not infinity but depending on the interaction between aspect ratio and the periodic unit cell 50, it may be more than sufficient. For instance, the dipole moment of an isolated infinitely permeable sphere and that of a sphere of permeability 30 exposed to the same field, only differ by 10%.

The net result is that the dielectric constant of the skin for the TM polarization is bound to grow faster than the permeability for the TE direction. However, as pointed out, there is room to spare in TM.

When the E-field is perpendicular to the axis of the threads, the transverse dipole moment increases the effective permittivity. When the H-field is perpendicular to the threads, the effective permeability is increased by the transverse dipole moment. The whole design is then a clear exercise in trade-offs. For the transverse field orientations, the derivation of the effective permittivity and permeability is discussed in detail below. The derivations are as follows:

For fields in the transverse directions:

$$\in_{eff}^{cylinders}=1.0+1.27f_a. \quad (12)$$

where $f_a$ is the area fraction occupied by the thread $\mu_{eff}^{cylinders}=1.0+1.27f_a*$ k, where k is the derate factor=

$$\frac{(\mu_i-1)\left(1-\frac{b^2}{a^2}\right)}{(\mu_i+1)-\frac{b^2(\mu_i-1)^2}{a^2(\mu_i+1)}} \quad (13)$$

The derate factor, k, accounts for the finite permeability and the tube geometry.

For the threads occupying 30% of the unit cell's area, 13% of which is nickel, which provides k=0.822 and so:

$$\in_{transverse}^{eff}=1.381, \mu_{transverse}^{eff}=1.313 \quad (14)$$

For the z-direction, since $f_a^{\mu_i}$ is 0.13, the value for the effective permittivities are:

$$\mu_z^{eff}=1+3.77*k_m(\rho), \in_z^{eff}=1.0+g(\rho) \quad (15)$$

where $k_m(\rho)$ is the derate factor for the z-directed magnetic field that expresses the effect of the aspect ratio of the thread ($\rho$) relative to the aspect ratio of the periodic unit cell. Similarly, $g(\rho)$ is the function that controls the z-directed electric dipole moment of the thread as a function of the aspect ratio and the unit cell.

It must be reiterated that in the presence of a dielectric matrix, the effective permittivities are usually interpreted as multiplicative factors. This holds for the transverse value given above. However, in the case of the polarization of the threads in the z-direction, the principal charge accumulation will be outside the dielectric. Thus, the usual rule of thumb does not apply and $g(\rho)$ must be determined by solving the Laplace equation including the presence of the dielectric slab. Until the Laplace equation problem is solved, the worst case effect of the present invention on the TM performance of the material cannot be determined. However, it is possible to proceed with the critical TE design.

The parameters chosen in the above sections for the thread diameters and the nickel thickness are the worst case. For absorber panel applications in the 2 GHz to 18 GHz range, the nickel's diamagnetic relaxation may be permitted to drop as low as 25 GHz. The slight increase in loss and drop of permeability that will start to take place in the 15 GHz to 18 GHz range can be accommodated in the design. The benefit is that the laminate thickness grows to 3,145 Å. This translates into a drop of the area consumed by the thread to achieve a given area fraction of magnetic metal. That is, to obtain a magnetic metal area fraction of 13% would only take about 24.8% of thread area instead of the 30% assumed above. Likewise, if microfibers smaller than DuPont's MICROMATTIQUE are utilized, in the 3000 Å range for example, the ratio of magnetic metal area to wasted area is decreased. Changes in both these directions will increase the effective permeability of the skin and decrease its effective permittivity, making the design all the more efficient.

Pushing these constraining parameters to their limit is to be the subject of future research together with the analytic determination of the TM properties. In what follows a demonstration that sufficient magnetic properties can be imparted to a dielectric skin to enhance its TE transmissivity at 45° incidence is provided.

For the TE case, the Electric field is purely transverse to the fibers. The magnetic field has a component along the z-direction and a component along the transverse direction. If an infinite 3-dimensional array of thread elements were available, then the z-directed permeability and the transverse-directed one would be the elements of a uniaxial diagonal tensor. Then for any angle of propagation, the average permeability can be estimated as the mixing of the two tensor elements. The behavior of the single layer of threads will doubtless deviate from this simple assumption, but it is reasonable to assume that, to first order, the 45° permeability will be given by:

$$\mu(45)=1+\sqrt{((\mu_{transverse}-1)*\cos(45))^2+((\mu_z-1)*\sin(45))^2}=3.67 \quad (16)$$

The aspect ratio derate factor may drop as low as 3.3, but more efficient packing of the thread, smaller microfibers and dropping the relaxation frequency to 25 GHz can raise it as high as 5.5. For the purposes of this exercise it is assumed that the full z-directed value of 13% nickel, namely $\mu^{eff}$=4.77 is obtained.

Now, assuming that our base dielectric has a dielectric constant of 2.6, the inclusion of 30% metal fibers will increase its transverse permittivity, by equation 5, to $\in^{eff}$= 1.38* 2.6=3.59.

Since the diamagnetic relaxation of the fibers are being brought into the range of operation, it is necessary to model the effective permeability as a function of frequency. An appropriate broadband model is that of an effective Debye material with the behavior:

$$\mu_r^{eff}(\omega) = \mu_\infty + (\mu_{DC} - \mu\infty) * \left\{ \frac{\frac{5}{6}}{1+(\omega\tau)^2} + \frac{\frac{1}{6}}{1+(\omega\tau/25)^2} \right\} \quad (17)$$

$$\mu_i^{eff}(\omega) = -j(\mu_{DC} - \mu_\infty) * \left\{ \frac{\frac{5}{6}(\omega\tau)}{1+(\omega\tau)^2} + \frac{\frac{1}{6}(\omega\tau/25)}{1+(\omega\tau/25)^2} \right\} \quad (18)$$

Here $\mu_\infty$ is the effective permeability when the magnetic metal has been forced into full diamagnetism by the induced eddy currents (typically for the field aligned with the cylinder this would be 1-$f_a$) and $\mu_{DC}$ is the low frequency effective permeability chosen above to be 4.77.

Figure 6:
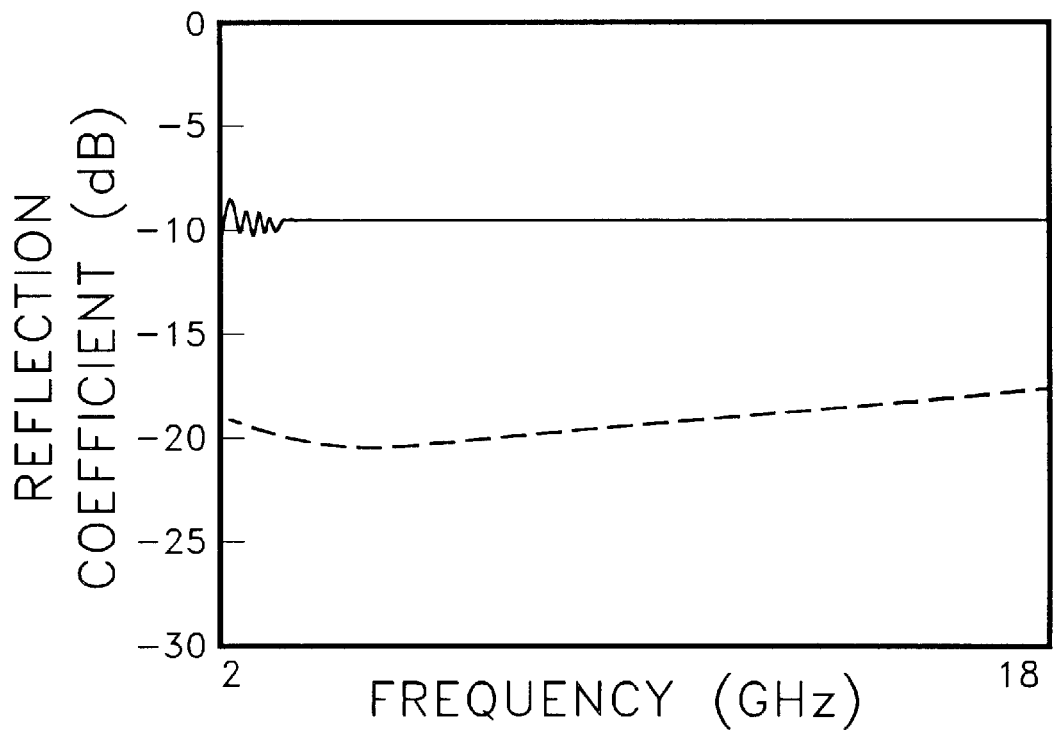
FIG. 6 is a graph showing the effect of material parameters on the front face reflection for TE polarization at 45° incidence from a semi-infinite dielectric half-space ($\epsilon_r$=2.6, $\mu_r$=1.0 for conventional as shown by solid line, $\epsilon_r$=3,59, $\mu_r$=4.77 for this invention as shown by dashed line.

Referring now to FIG. 6, the effect of these material parameters on the front face reflection from a semi-infinite dielectric half-space. The solid curve is the front face reflection at 45° TE incidence to a half-space of permittivity 2.6 and permeability 1.0. The dashed curve is the result for a half-space of permittivity 3.59 and DC permeability of 4.77 relaxing at 40 GHz. As desired, the inclusion of the fibers increased the magnetic properties sufficiently to overcome the increase in the dielectric properties and produced a net improvement in the match. The improvement is of the order of 10 dB across the band. The same physical parameters at 60° incidence yield an improvement of the order of 5 dB.

Since asphalt has a dielectric constant of the order of 2.6, the results of FIG. 6 are indicative of the reduction in the road's reflection coefficient that can also be obtained by using a topcoat formed according to the present invention, with some moderate loss. Similarly, since a dielectric constant of 2.6 is probably the lowest possible attainable value for an aerospace quality dielectric skin, the results of FIG. 6 indicate the kind of improvement in the transparency of such skins afforded by this approach. Thus, the approach of the present invention is viable.

To continue the exercise with a more concrete application example, consider a graded dielectric absorber covered with a dielectric skin of the order of 0.021 inches thick. First, a pure dielectric of permittivity 2.6 is considered, and then the same synthetic magnetodielectric as in our previous example is considered. Such a magnetodielectric with 45° parameters of $\mu_{DC}$=4.7 and $\in$=3.59, will have parameters at normal incidence completely controlled by the transverse dipole moments of the order: $\in$=3.59 and $\mu_{DC}$=1.313.

Figure 7:
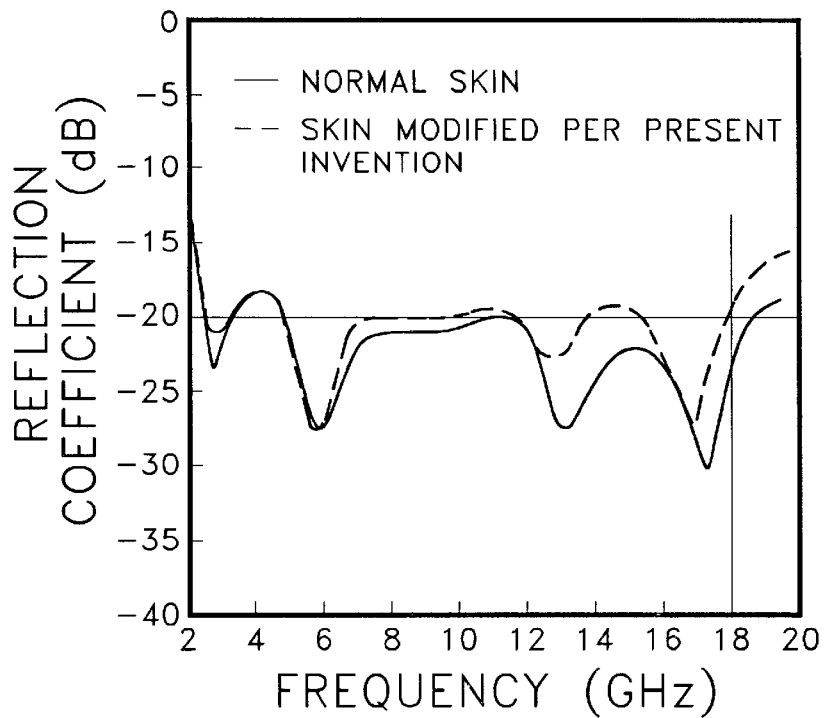
FIG. 7 is a graph showing the reflection coefficient at normal incidence for an absorber panel covered with a 0.021" thick skin designed according to the present invention.
Figure 8:
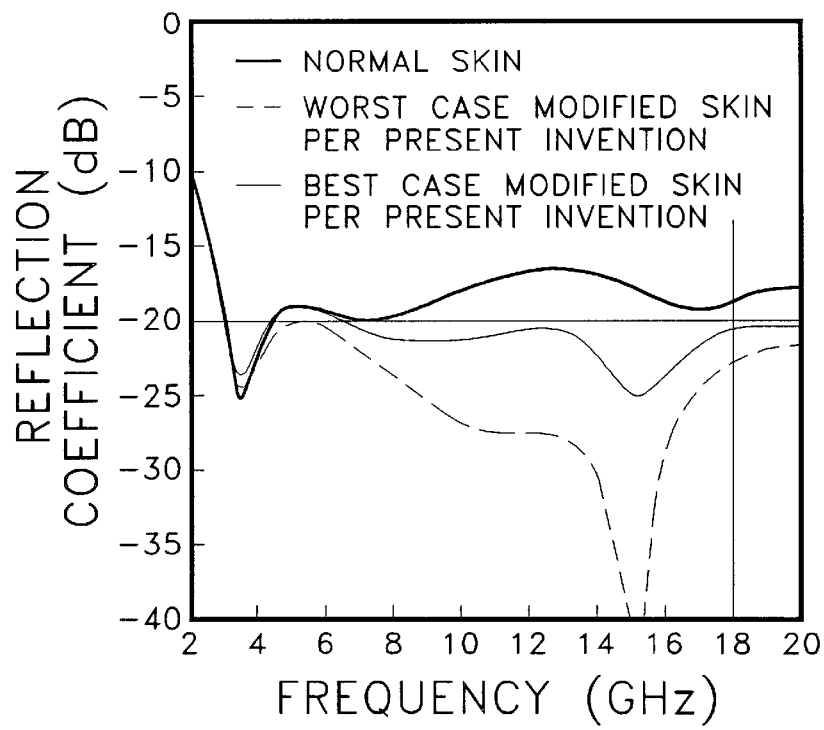
FIG. 8 is a graph showing the reflection coefficient for 45 degrees, according to the present invention.

Referring now to FIGS. 7 and 8, FIG. 7 shows the reflection coefficient at normal incidence for this design is shown. The solid line is with the pure dielectric skin, the dashed line is with a skin formed according to the present invention. Note that the synthetic magnetodielectric skin, designed to improve the performance at 45°, has a negligible effect at normal incidence, as desired. FIG. 8 shows the results at 45°. Again, the solid line is with the pure dielectric skin. The dashed line is with the skin of the present invention, having a permeability of 4.77. The dotted line is the worst case wherein the skin has a permeability down to 3.3. Clearly, improvements in the high frequency absorption level of the panel of the order of 5 to 10 dB are possible.

Finally, a new kind of backwall compact range absorber is discussed. Assume that magnetic metal threads or rods are embedded into a low dielectric constant absorbing pyramid. Then each side of the pyramid looks like our synthetic magnetodielectric plane and all of the benefits can be derived therefrom. For conventional lossy pyramids, waves with local TM incidence are readily absorbed. However, those with local TE incidence are poorly matched and must undergo multiple reflections along a deep pyramid to be absorbed. This is one of the reasons why typical pyramids must be one wavelength deep at the lowest frequency of operation (that is, close to five feet deep to work at 500 MHz. However, if a pyramid of frequency dependent CA CORE (circuit analog core, a material such as honeycomb, within which circuits are formed so as to provide desired electromagnetic response, such as high lossy permittivity, for example) is made and then the synthetic magnetodielectric effects are added, some of the excess TM performance can be sacrificed to improve the TE response.

Suppose that at 45° incidence the TE field sees the following material properties for the permittivity, a Debye material with DC conductivity of 0.013 mhos/meter, an infinite frequency permittivity of 1.5 and a one branch Debye permittivity of 1.0 relaxing at 4 GHz. For the permeability, a DC permeability of 4.77, with a diamagnetic permeability limit of the order of 0.7 and relaxing at 5 GHz using 13% (volume percent) nickel.

Figure 9:
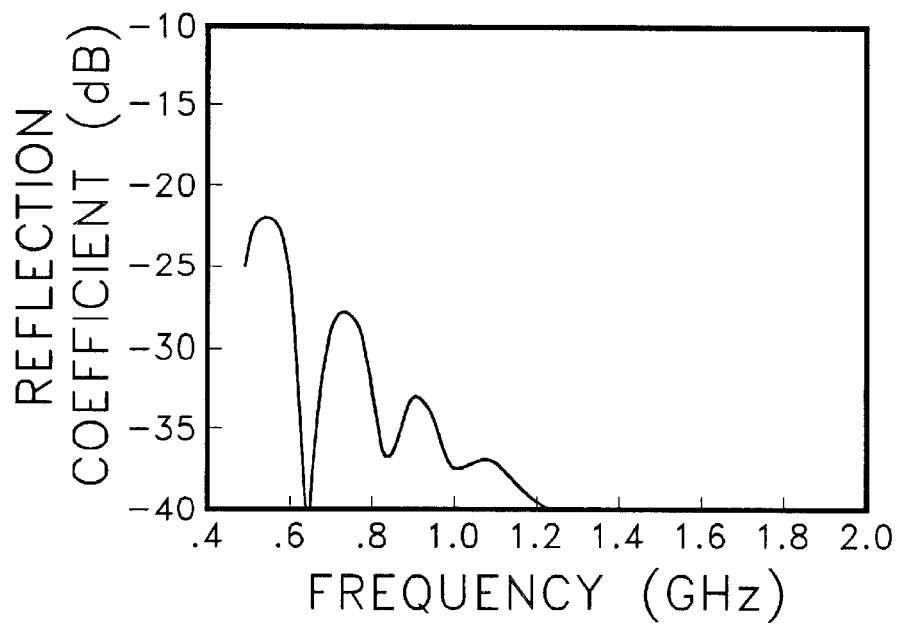
FIG. 9 is a graph showing the TE reflection coefficient at 45° incidence from 500 MHz to 2.0 GHz, for a layer 10 inches thick, according to the present invention.

Referring now to FIG. 9, the TE reflection coefficient from 500 MHz to 2.0 GHz for a layer 10 inches thick is shown.

Figure 10:
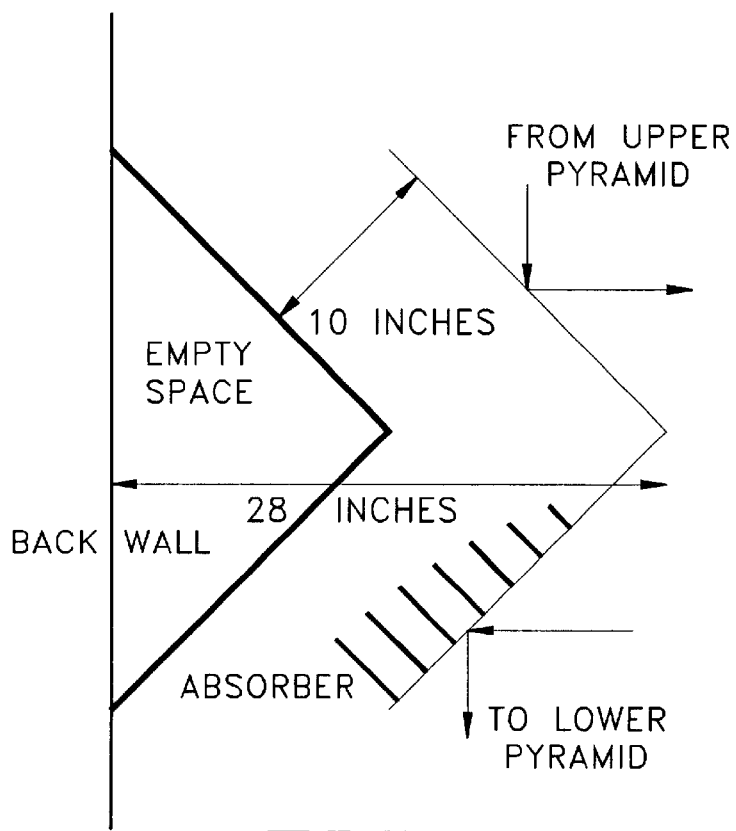
FIG. 10 is a graph showing a 45 degree wedge geometry for anechoic chamber back wall application using the material of FIG. 9 which always provides at least two bounces on the absorber, before electromagnetic radiation is reflected back toward the source.

Referring now to FIG. 10, a 45° geometry always means there will be at least two bounces on the absorber before returning to the source, this material would give an effective absorption of the order of −44 dB at 500 MHz and of the order of −65 dB at 1.0 GHz. Yet, as suggested in FIG. 10, its total depth need not exceed 28 inches. This represents a reduction in depth of a factor of two and an even greater reduction in weight. If the nickel content is increased above the assumed 13%, the material becomes proportionately thinner. Since the diamagnetic relaxation of the magnetic metal is being used as a source of loss, the material will become mismatched at high frequencies. However, at high frequencies the software and hardware gates used in the compact range become increasingly more effective.

Figure 11:
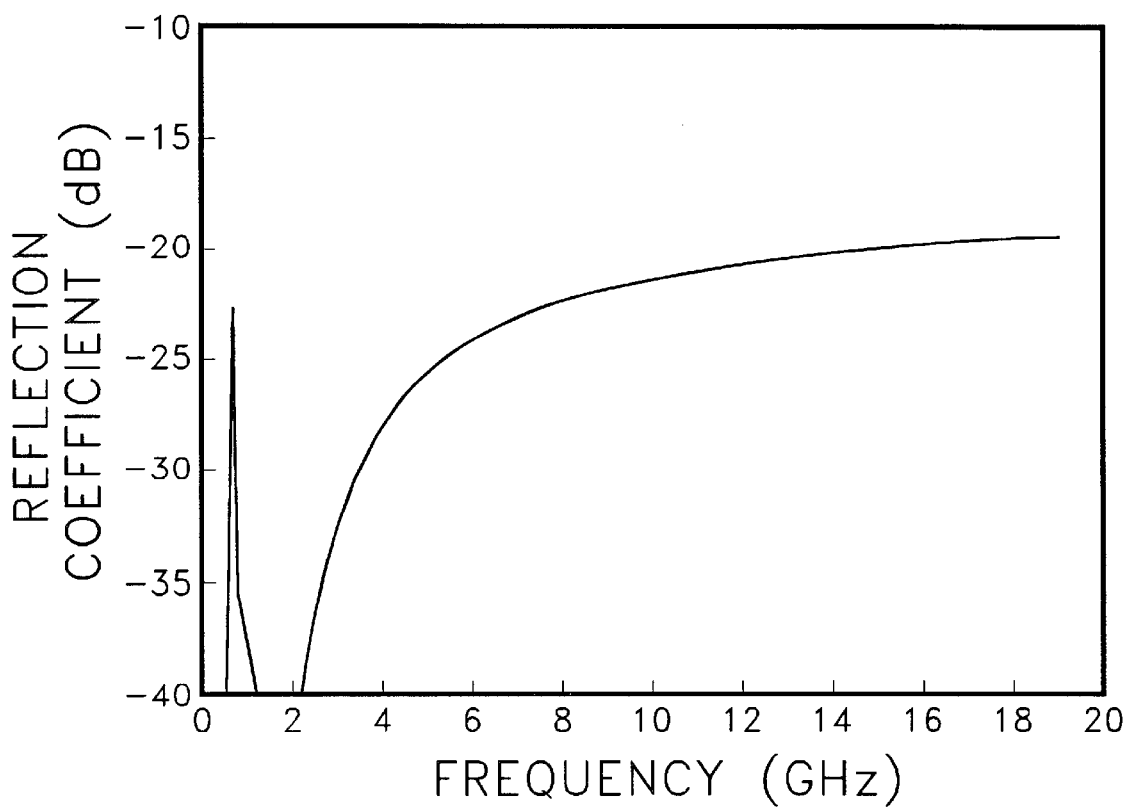
FIG. 11 is a graph showing the round trip loss implied by the arrangement of FIG. 10 so as to provide an absorber for a compact range according to the present invention; and, FIG. 12 shows the dimensions of a unit cell.

Referring now to FIG. 11, the round trip loss of about −40 dB implied by the broadband results is probably more than sufficient to give the compact range the desired performance.

The above calculations show that the synthetic magnetodielectric material of the present invention can yield a new class of synthetic magnetodielectric surface with controllable off-normal TE reflectivity, transmissivity or absorption which can be tuned to a desired frequency and angle of incidence range. Its applicability to radome transparencies, absorber panels and bulk absorbers has been demonstrated.

Follow on research will address the design parameters required to maintain the TM properties of the surface at an acceptable level and also determine the optimal ratio of increased permeability to increased permittivity attainable with existing or new manufacturing technologies.

Figure 12:
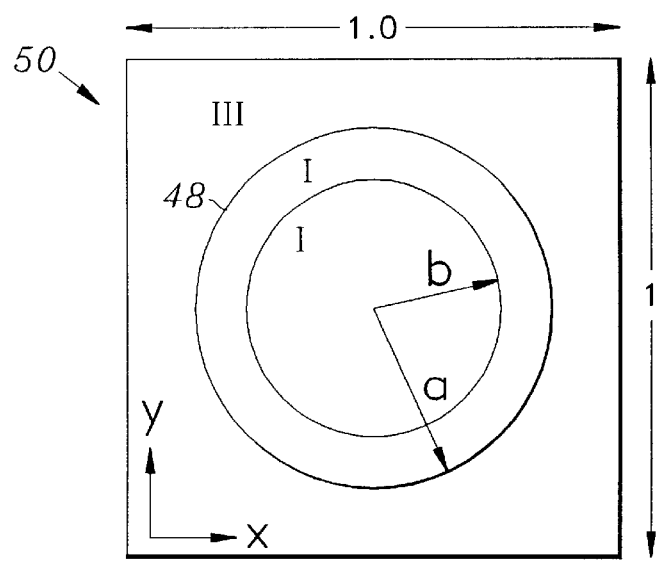

As reference, the derivation of equations (12) and (13) is done by considering the unit cell shown in FIG. 12. To first order, the effective increase in permittivity inside the cell, due to the presence of the cylinder, i.e., fiber 48 can be obtained as follows by applying a potential difference V between the upper and lower electric symmetry planes. The electric field due to this potential difference will induce a dipole moment on the cylinder. Calculate this dipole moment as if the cylinder were in free space. Then, let the dipolar electric field of the cylinder terminate on the symmetry planes, thus inducing an excess charge. Since C=Q/V and the potential difference V applied to the symmetry planes can be assumed to be fixed, the increase in C is the increase in total Q on the symmetry planes.

For simplicity it will be assumed that the total excess charge induced on the planes can be estimated from the normal E-field above and below the cylinder. Then it follows that $\in_{eff}=E_{after}/E_{before}$ where "before" and "after" refer to the insertion of the cylinder.

The field on the axis of a polarized cylinder of radius a at a distance r=0.5 is found in Jefimenko. Therefore it is concluded that:

$$\epsilon_{eff}^{cylinder} = \left[\frac{E\left(1+\frac{a^2}{r^2}\right)}{E}\right] = 1 + 4a^2 = 1 + 1.27 f_a \quad (19)$$

where $f=\pi a^2$ is the area fraction and where a is the diameter of the microfiber including the nickel coating and is the diameter of the microfiber alone.

The dipolar approximation used here agrees with the classic models within 6% for the range of radii of interest, and it is concluded that:

$$\in_{eff}^{cylinders}=1.0+1.27 f_a \text{ for } f_a \leq 0.5$$

(that is, valid up to 50% area fraction).

This expression as derived for a unit cell in air ($\in$=1.0) applies to any electric matrix as a multiplicative factor. To obtain the expression for effective permeability, it is necessary to derate the dipole movement of the cylinder by the fact that its $\mu \neq \infty$ and by the fact that it is a shell of thickness (a–b). This can be done by solving the potential problem in free space for the analogous case of a dielectric tube.

Using Cylindrical harmonics, under an applied external potential field $\Phi = -Er \cos\theta$, the potentials in each of the three regions of FIG. 12 are:

$$\text{I: } \varphi = \left(A_{31}r + \frac{B_{31}}{r^2}\right)\cos\theta, \epsilon\frac{\partial\varphi}{\partial r} = \left(A_{31} - \frac{B_{31}}{r^2}\right)\cos\theta \quad (20)$$

$$\text{II: } \varphi = \left(A_{21}r + \frac{B_{21}}{r^2}\right)\cos\theta, \epsilon\frac{\partial\varphi}{\partial r} = \left(\epsilon_2 A_{21} - \frac{\epsilon_2 B_{21}}{r^2}\right)\cos\theta \quad (21)$$

$$\text{III: } \varphi = (A_{11}r)\cos\theta, \epsilon\frac{\partial\varphi}{\partial r} = (A_{11})\cos\theta \quad (22)$$

Solving at r=∞ gives $A_{31}$=−E. Solving at the boundary between regions I and Ii, r=b, gives:

$$B_{21} = A_2\left(\frac{\epsilon_2 - 1}{1 + \epsilon_2}\right)b^2 \quad (23)$$

Substituting this result into the equations at the II, III boundary yields:

$$A_{21} = \frac{\frac{B_{31}}{a_2} - E}{1 + \frac{b^2}{a^2}\left(\frac{\epsilon_2 - 1}{1 + \epsilon_2}\right)}, A_{21} = \frac{-\frac{B_{31}}{a^2} - E}{\epsilon_2 - \epsilon_2 \frac{b^2}{a^2}\left(\frac{\epsilon_2 - 1}{1 + \epsilon^2}\right)} \quad (24)$$

Setting these equal to each other and solving for $B_{31}$, provides:

$$\frac{B_{31}}{a^2} = E\frac{(\epsilon_2 - 1)\left(1 - \frac{b^2}{a^2}\right)}{(\epsilon_2 + 1) - \frac{b^2}{a^2}\frac{(\epsilon_2 - 1)^2}{(\epsilon + 1)}} \quad (25)$$

In the limit b=0, this reduces to ($\in$−1)/($\in$+1), which for $\in$=30, gives 0.935. That is, the transverse dipole moment of a solid cylinder of finite permeability or permittivity of value 30.0 differs from that of the same cylinder with infinite permeability or permittivity by less than 7%.

Letting b be the radius of the MICROMATTIQUE fibers= 5880 Å, and add that to the thickness of nickel desired (2250 Å), to obtain a, it is possible to estimate the transverse dipole moment of the nickel tube to be 0.822. The tube has 88% of the dipole moment of a solid cylinder.

Therefore the transverse dipolar contribution to the effective permittivity and permeability can be determined from the area fraction occupied by the threads.

It is understood that the exemplary synthetic magnetodielectric described herein and shown in the drawings represents only presently preferred embodiments of the invention. Indeed, various modifications and additions may be made to such embodiments without departing from the spirit and scope of the invention. Those skilled in the art will appreciate that various modifications and additions may be implemented to adapt the present invention for use in a variety of different applications.

What is claimed is:

1. A method for forming an electromagnetic radiation absorbing/transmitting composite material suitable for application to a composited structure, the method comprising the steps of:
    a) providing a sheet of fabric having first and second surfaces;
    b) placing magnetically permeable thread into the fabric;
    c) impregnating the fabric with resin;
    d) curing the resin impregnated fabric to substantially affix the thread thereto; and
    e) removing portions of the thread proximate the first and second surfaces of the fabric to define a plurality of magnetically permeable elements.

2. The method as recited in claim 1, wherein step of providing a sheet of fabric comprises providing a fabric formed of an insulating material.

3. The method as recited in claim 1, wherein the step of placing magnetically permeable thread into the fabric comprises placing thread having a permeability substantially greater than the permeability of free space.

4. The method as recited in claim 1, wherein the step of placing magnetically permeable thread into the fabric comprises placing resin pre-impregnated magnetically permeable thread into the fabric.

5. The method as recited in claim 1, wherein the step of placing magnetically permeable thread into the fabric comprises placing the magnetically permeable thread into the fabric so as to define a plurality of magnetically permeable elements which extend generally from the first surface of the fabric to the second surface of the fabric, each magnetically permeable element generally comprising a first end proximate the first surface and a second end proximate the second surface of the fabric.

6. The method as recited in claim 1, wherein the step of placing magnetically permeable thread into the fabric comprises placing thread comprising an insulating material having a magnetically permeable coating formed thereon into the fabric.

7. The method as recited in claim 1, wherein the step of placing magnetically permeable thread into the fabric comprises placing thread comprising metal into the fabric.

8. The method as recited in claim 1, wherein the step of placing magnetically permeable thread into the fabric comprises placing thread comprising nickel into the fabric.

9. The method as recited in claim 1, wherein the step of placing magnetically permeable thread into the fabric comprises placing thread comprising microfibers into the fabric.

10. The method as recited in claim 1, wherein the step of placing magnetically permeable thread into the fabric comprises placing a plurality of magnetically permeable fibers into the fabric.

11. The method as recited in claim 1, wherein the step of placing magnetically permeable thread into the fabric comprises sewing the thread into the fabric.

12. The method as recited in claim 1, wherein the step of placing magnetically permeable thread into the fabric comprises weaving the thread into the fabric.

13. The method as recited in claim 1, wherein the step of impregnating the fabric with the resin comprises pre-impregnating the fabric with resin.

14. The method as recited in claim 1, wherein the step of impregnating the fabric with the resin comprises applying the resin to the fabric immediately prior to curing.

15. The method as recited in claim 1, wherein the step of removing portions of the thread comprises removing portions of the thread proximate the first and second surfaces of the farbic so as to define magnetically permeable elements disposed generally normal to the first and second surfaces of the fabric.

16. A method for forming a synthetic magneto-dielectric composite material for absorbing/transmitting electromagnetic radiation, the method comprising the steps of:
  a) providing a sheet of fabric formed of an insulating material, the sheet having first and second surfaces;
  b) placing magnetically permeable thread into the fabric and removing those portions of the magnetically permeable thread which are disposed proximate the first and second surfaces of the fabric so as to define a plurality of magnetically permeable elements, the magnetically permeable thread comprising a material having a permeability greater than the permeability of free space;
  c) impregnating the fabric with resin; and
  d) curing the resin impregnated fabric;
  e) wherein the magnetically permeable thread is configured to provide predetermined off-normal TE and TM response within a selected frequency range, so as to provide desired absorption/transmission of electromagnetic radiation.

17. The method as recited in claim 16, further comprising the step of configuring the magnetically permeable thread so as to provide approximately equal off-normal TE and TM response within the selected frequency range.

18. The method as recited in claim 16, wherein the step of placing magnetically permeable thread into the fabric comprises placing thread having a permeability substantially greater than the permeability of free space into the fabric.

19. The method as recited in claim 16, wherein the step of placing magnetically permeable thread into the fabric comprises placing thread having a relative permeability greater than 30 in the frequency range of 2 GHz to 18 GHz into the fabric.

20. The method as recited in claim 16, wherein the step of providing a fabric comprises providing a fabric comprising a material having a permittivity substantially greater than the permittivity of free space.

21. The method as recited in claim 16, wherein the step of providing a fabric comprises providing a fabric comprising a material having a relative permittivity greater than approximately 30 in the frequency range of approximately 2 GHz to approximately 18 GHz.

22. The method as recited in claim 16, wherein the step of providing a sheet of fabric comprises providing a sheet of fabric having a permittivity greater than the permittivity of free space.

23. The method as recited in claim 16, wherein the step of impregnating the fabric with resin comprises impregnating the fabric with resin having a permittivity greater than the permittivity of free space.

24. The method as recited in claim 16, wherein permeability and the permittivity of the synthetic magnetodielectric composite material are approximately equal.

25. The method as recited in claim 16, wherein the permeability and the permittivity of the synthetic magneto-dielectric composite material are approximately equal and wherein the imaginary parts of the permeability and permittivity are sufficiently large to provide desired electromagnetic radiation absorption.

26. The method as recited in claim 16, wherein the step of placing magnetically permeable thread into the fabric comprises placing the magnetically permeable thread into the fabric so as to define a plurality of magnetically permeable elements which extend generally from the first surface of the fabric to the second surface of the fabric, each magnetically permeable element generally comprising a first end proximate the first surface and a second end proximate the second surface of the fabric.

27. The method as recited in claim 16, wherein the step of placing the magnetically permeable thread into the fabric comprises placing the magnetically permeable thread into the fabric such that it extends repeatedly from proximate the first surface to proximate the second surface thereof and further comprising the step of abrading the first and second surface of the fabric after curing, so as to remove portions of the thread proximate the first and second surfaces of the fabric to form a plurality of permeable elements within the fabric.

28. The method as recited in claim 16, wherein the step of providing a sheet of fabric comprises providing an insulating material.

29. The method as recited in claim 16, wherein the step of placing magnetically permeable thread into the fabric comprises placing thread comprising an insulating material having a magnetically permeable coating formed thereon into the fabric.

30. The method as recited in claim 16, wherein the step of placing magnetically permeable thread into the fabric comprises placing thread comprising metal into the fabric.

31. The method as recited in claim 16, wherein the step of placing magnetically permeable thread into the fabric comprises placing thread comprising nickel into the fabric.

32. The method as recited in claim 16, wherein the step of placing magnetically permeable thread into the fabric comprises placing thread comprising an insulating material having a coating of surface-oxidized, substantially pure nickel formed thereon into the fabric.

33. The method as recited in claim 16, wherein the step of placing magnetically permeable thread into the fabric comprises placing thread comprising microfibers into the fabric.

34. The method as recited in claim 16, wherein the step of placing magnetically permeable thread into the fabric comprises placing thread comprising plastic microfibers into the fabric.

35. The method as recited in claim 16, wherein the step of placing magnetically permeable thread in the fabric comprises placing thread comprised of dielectric fibers having a magnetically permeable coating formed thereon, the diameter of the fibers being less than two and one half times the thickness of the magnetically permeable coating.

36. The method as recited in claim 16, wherein the step of placing magnetically permeable thread into the fabric comprises placing thread comprised of substantially solid metal microfibers into the fabric.

37. The method as recited in claim 16, wherein the step of placing magnetically permeable thread into the fabric comprises placing thread comprised of surface oxidized, substantially pure nickel microfibers into the fabric.

38. The method as recited in claim 16, wherein the step of impregnating the fabric with the resin comprises pre-impregnating the fabric with resin.

39. The method as recited in claim 16, wherein the step of impregnating the fabric with the resin comprises applying the resin to the fabric immediately prior to curing.

40. The method as recited in claim 16, wherein the step of placing magnetically permeable thread into the fabric comprises placing a plurality of magnetically permeable fibers into the fabric.

41. The method as recited in claim 16, wherein the step of placing magnetically permeable thread into the fabric comprises sewing the thread into the fabric.

42. A method for forming a electromagnetic radiation absorbing/transmitting composite structure, the method comprising the steps of:
    a) providing a sheet of fabric having first and second surfaces, the fabric being formed of an insulating material;
    b) placing magnetically permeable thread into the fabric, the magnetically permeable thread having a permeability greater than the permeability of free space;
    c) removing portions of the thread proximate the first surface of the fabric;
    d) impregnating the fabric with resin;
    e) adding the resin impregnated fabric to a pre-existing composite structure with the first surface of the resin impregnated fabric contacting the pre-existing composite structure;
    f) curing the resin impregnated fabric; and
    g) removing portions of the thread proximate the second surface of the fabric;
    h) wherein removing portions of the thread proximate the first and second surfaces of the fabric defines magnetically permeable elements dispose generally normal to the first and second surfaces of the fabric.

43. A method for forming an electromagnetic radiation absorbing/transmitting composite material suitable for application to a composited structure, the method comprising the step of:
    a) providing a sheet of fabric having first and second surfaces, the fabric being formed of an insulating material;
    b) pre-impregnating magnetically permeable thread with resin, the magnetically permeable thread having a permeability greater than the permeability of free space;
    c) placing the resin pre-impregnated magnetically permeable thread into the fabric;
    d) curing the resin pre-impregnated magnetically permeable thread, so as to substantially affix the thread to the fabric;
    e) removing portions of the thread proximate the first and second surfaces of the fabric so as to define magnetically permeable elements disposed generally normal to the first and second surfaces of the fabric.

44. A method for forming a synthetic magneto-dielectric composite material for absorbing/transmitting electromagnetic radiation, the method comprising the steps of:
    a) providing a sheet of fabric formed of an insulating material, the sheet having first and second surfaces;
    b) placing magnetically permeable thread into the fabric such that it extends repeatedly from proximate the first surface to proximate the second surface thereof, the magnetically permeable thread comprising a material having a permeability greater than the permeability of free space;
    c) impregnating the fabric with resin;
    d) curing the resin impregnated fabric; and
    e) abrading the first and second surfaces of the fabric after curing so as to remove portions of the thread proximate the first and second surfaces of the fabric to form a plurality of permeable elements within the fabric;
    f) wherein the magnetically permeable thread is configured to provide predetermined off-normal TE and TM response within a selected frequency range, so as to provide desired absorption/transmission of electromagnetic radiation.

* * * * *

UNITED STATES PATENT AND TRADEMARK OFFICE
CERTIFICATE OF CORRECTION

PATENT NO.    : 6,440,244 B1  Page 1 of 1
DATED         : August 27, 2002
INVENTOR(S)   : Rodolfo E. Diaz et al.

It is certified that error appears in the above-identified patent and that said Letters Patent is hereby corrected as shown below:

<u>Title page,</u>
Item [73], Assignee, insert:
-- [73]   Assignee:   Northrop Grumman Corporation, Los Angeles, (CA) --

Signed and Sealed this

First Day of April, 2003

JAMES E. ROGAN
*Director of the United States Patent and Trademark Office*